US006728156B2

United States Patent
Kilmer et al.

(10) Patent No.: US 6,728,156 B2
(45) Date of Patent: Apr. 27, 2004

(54) MEMORY ARRAY SYSTEM

(75) Inventors: Charles A. Kilmer, Chittenden, VT (US); Shanker Singh, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/095,871

(22) Filed: Mar. 11, 2002

(65) Prior Publication Data

US 2003/0169634 A1 Sep. 11, 2003

(51) Int. Cl.$^7$ ................................................. G11C 7/00
(52) U.S. Cl. ............ 365/222; 365/189.07; 365/189.05; 365/236; 365/230.01
(58) Field of Search ........................ 365/222, 189.07, 365/189.05, 236, 230.01

(56) References Cited

U.S. PATENT DOCUMENTS

| | | | |
|---|---|---|---|
| 4,277,838 A | 7/1981 | Chambers | 365/222 |
| 4,359,771 A | 11/1982 | Johnson et al. | 371/13 |
| 5,321,661 A | 6/1994 | Iwakiri et al. | 365/222 |
| 5,343,430 A | 8/1994 | Furuyama | 365/201 |
| 5,381,373 A | 1/1995 | Ohsawa | 365/201 |
| 5,446,695 A | 8/1995 | Douse et al. | 365/222 |
| 5,475,646 A | 12/1995 | Ogihara | 365/222 |
| 5,642,320 A | 6/1997 | Jang | 365/222 |
| 5,644,545 A | 7/1997 | Fisch | 365/222 |
| 5,703,823 A | 12/1997 | Douse et al. | 365/222 |
| 5,805,854 A | 9/1998 | Shigeeda | 395/401 |
| 5,812,481 A | 9/1998 | Numata et al. | 365/230.06 |
| 5,903,505 A | 5/1999 | Wik et al. | 365/222 |
| 5,909,404 A | 6/1999 | Schwarz | 365/201 |
| 5,935,263 A * | 8/1999 | Keeth et al. | 714/718 |
| 5,986,944 A * | 11/1999 | Merritt | 365/189.05 |
| 5,991,214 A | 11/1999 | Merritt et al. | 365/201 |
| 6,002,622 A | 12/1999 | Dean | 365/201 |
| 6,028,805 A | 2/2000 | Higuchi | 365/222 |
| 6,094,389 A | 7/2000 | Ahn | 365/201 |
| 6,172,935 B1 * | 1/2001 | Wright et al. | 365/233 |
| 2001/0015927 A1 * | 8/2001 | Ooishi | 365/201 |
| 2002/0004922 A1 * | 1/2002 | Manning | 714/720 |
| 2002/0071316 A1 * | 6/2002 | Manning | 365/189.05 |
| 2003/0088818 A1 * | 5/2003 | Manning | 714/724 |

FOREIGN PATENT DOCUMENTS

| | | | |
|---|---|---|---|
| JP | 58045692 | 3/1983 | G11C/11/34 |
| JP | 402027590 | * 1/1990 | G11C/11/406 |
| JP | 11250694 | 2/1998 | G11C/29/00 |
| JP | 11086598 | 5/1998 | G11C/29/00 |

OTHER PUBLICATIONS

U.S. application Ser. No. 09/716,915, Filed Nov. 20, 2000.

* cited by examiner

Primary Examiner—Viet Q. Nguyen
(74) Attorney, Agent, or Firm—Esther E. Klein

(57) ABSTRACT

A memory array system is provided comprising a plurality of rows of memory cells, each row having an address, wherein each memory cell stores volatile data requiring periodic refreshing. A refresh controller controls the periodic refreshing of data in each row of memory cells. A refresh address counter indicates the address of the row of cells for refreshing. A temporary data storer is used for storing data from the memory cell indicated for refreshing. A data inverter inverts data from the memory cell indicated for refreshing. A comparator associated with the temporary data storer and the data inverter compares data in those devices. An indicator bit is associated with the refresh address counter to indicate whether the data stored in the address indicated by the refresh address counter is inverted.

5 Claims, 5 Drawing Sheets

MEMORY ARRAY SYSTEM

TECHNICAL FIELD

The present invention relates in general to memory array systems and more particularly to versatile memory array systems that can be used in a variety of applications.

BACKGROUND OF THE INVENTION

Computer systems incorporate volatile memory devices such as dynamic random access memories (DRAMs) to store digital data used by the system. Memory arrays are groups of memory cells organized as rows and columns wherein each memory cell contains one bit of data. The technology used to design memory devices has advanced so that more and more data can be stored on a single memory device chip.

In a memory array, the rows are selected by row decoders that are typically located adjacent to the end of the row lines. Each of the row lines is electrically connected to the row decoders so that the appropriate signals can be received and transmitted. The columns of the memory array are connected to input/output devices such as a read/write multiplexer. In the case of DRAMs, the memory array columns are also connected to line pre-charging sense amplifier circuits at the end of each column line.

In order to store data in the DRAM or to access stored data, it is necessary to specify a storage location on the memory array. A row address and column address are provided from an external source to decoders so that a word line and a sense amplifier can be selectively activated in order to read from or write to a desired portion on the memory array.

There is a need to be able to detect certain errors that can occur within a memory cell which is no longer functioning properly. Early memory chips were organized so that each chip provided one-bit of data for each address. Currently memory chips frequently are organized into sets of 4-bits of data for each address. If one of these memory chips fails the result is potentially erroneous data bits. Therefore, the error correction code needs to be designed for 4-bit error detection.

Incorporating a 4-bit error detection and 1-bit correction code in a 64 or 128-bit memory system would require eight or nine check bits. Modern memory buses are often 64 or 128-bits wide. Currently memory arrays are frequently used in personal computers which are requiring 32 MB to 256 MB memory systems. Presently memory arrays typically contain 256 megabit devices and the trend is towards production in memory arrays that will contain 1–4 gigabits within 2 to 4 years.

With the anticipated increase in memory array sizes, the present approach of utilizing 1 or 4-bit wide memory chip organization is being reconsidered. For example, employing the present 1 or 4-bit memory chip organization with the 32-bit wide dataword will require a 32 memory array with 1-bit organization or 8 memory arrays with 4-bit organization. This will, in turn, result in a minimum granularity of 8 GB or 4 GB respectively. This large amount of memory in a computer system such as a desktop or laptop is excessive and unnecessary and will increase the overall cost of the system. In response to the minimum granularity problem, memory array manufacturers are moving to 8, 16 and even 32-bit wide memory organization schemes with a corresponding increase in the number of bits required for array detection and correction. Accordingly, what is also needed is an improved error detection technique that minimizes the cost, the system and the extra amount of bits required in detecting and correcting errors. Such a system is provided in U.S. patent application Ser. No. 09/716,915 hereby incorporated by reference.

The contents of the volatile storage devices such as DRAMs fade overtime. Refresh operations are used to periodically rewrite the date into each memory cell. During a refresh operation, the contents are stored temporarily in the sense latch, a buffer, or a register and then rewritten into the same address where it previously was stored so that it is fresh. The timing for the refresh operation is dependent on the system. A refresh address counter keeps track of which row is to be refreshed during a refresh cycle. A memory cell connected to the word line which is selected with the refresh address is refreshed during the operation.

Refreshing the DRAM requires power consumption which puts a stress on the power requirements of the overall system. Therefore, it is desirable to be able to minimize the frequency of refreshes while ensuring that the data is not lost by disappearing before the memory cell is refreshed. There are fluctuations in the amount of time that a given memory cell can hold its charge to maintain the data, which varies from cell to cell. Therefore, it would be desirable to optimize the power consumption of a DRAM by using the cells in the DRAM that can go for longer periods without being refreshed In general, the goal is to minimize the size and cost of the DRAM systems. Another goal is to provide flexibility so that a DRAM can be initially designed and built for general use and can later be designated for a particular purpose, such as a hand held device and a Palm computer. A Palm computer system, for example, has certain temperature and battery power requirements which can effect refresh interval requirements. A Palm computer also has specific requirements regarding power consumption limitations.

The temperature of the system in which the DRAM will be placed and power consumption limitations have an effect on how often a refresh operation needs to be performed. A DRAM can be optimized for a specific system by using those word lines or memory cells with the greatest capacity to endure certain temperatures without losing data or without requiring refresh cycles as frequently.

Even after the system is installed in a system, use of DRAMs having extra wordlines and memory cells that can be selectively activated would provide greater flexibility. It is also desirable that the swapping out of a defective memory cell be done without system intervention, without increasing the chip size, performance penalties and the cost of the chip.

It is desirable that the on-chip error detection be performed without system intervention since the retention time is very strongly coupled to the temperature and the cell signal strength is strongly related to other external environmental conditions. Use of a DRAM chip in an external system alters the temperature of the memory cell so the true tolerance level can be found. It is preferable for the DRAM system to monitor failure and adjust the refresh interval time between refresh cycles accordingly. This would allow the system to increase the interval during periods of inactivity when the device is cooler and other environmental conditions are favorable. This would, in turn, reduce the power consumed by the device.

Finally, it is desirable for a device to use its own error signal to adjust its own self-refresh interval. A single part number could be used to satisfy low power and standard applications. It is desirable for the memory unit to self-regulate its refresh interval, thereby minimizing power consumption. The need to sort by power requirements would be eliminated allowing the use of a generic part number.

One or more of the foregoing problems is solved and/or one or more of the foregoing needs is met by the present invention.

SUMMARY OF THE INVENTION

It is therefore an object of the invention to provide an improved memory array system. It is another object of the preferred embodiment of the invention to provide a system and method for detecting failures in a memory array. It is a further object of the preferred embodiment of the invention to provide a memory array system that can be flexibly adapted for use in a variety of applications with varying power consumption and temperature requirements.

A memory array system is provided comprising a plurality of rows of memory cells, each row having an address, wherein each memory cell stores volatile data requiring periodic refreshing. A refresh controller controls the periodic refreshing of data in each row of memory cells. A refresh address counter indicates the address of the row of cells for refreshing. A temporary data storer is used for storing data from the memory cell indicated for refreshing. A data inverter inverts data from the memory cell indicated for refreshing. A comparator associated with the temporary data storer and the data inverter compares data in those devices. An indicator bit is associated with the refresh address counter to indicate whether the data stored in the address indicated by the refresh address counter is inverted.

In accordance with a further embodiment of the invention a deactivation controller is provided for deactivating a row of cells. A cell address controller redirects requests for a row of cells to a second row of cells when the requested row is deactivated. A test system is used for testing each row of cells for the ability to store data without being refreshed for a designated period of time. A row that is unable to store data without being refreshed for a designated time is deactivated and relocated to another row.

In another aspect of the present invention a method is provided for detecting an error in a memory device having a plurality of cells organized in a plurality of rows and columns. During a first refresh operation data is read from a row of cells designated by a refresh counter that compliments the data as generated. The compliment of the data is stored in a temporary storage area. A bit associated with the refresh address counter to indicate that the first refresh operation has been performed is set. During a second refresh operation, data is read from a row of cells designated by the refresh address counter. A compliment of the data is generated. The data is compared to the data that is temporarily stored. An error signal is generated if the two data values are not exact. The complimented data is written to the row. The bit is reset to indicate that the second refresh operation has been performed. During a read operation the bit is used to indicate whether the data is complimented.

A further method provides for optimizing the tolerance levels for a memory device. A time and temperature parameter is set for performing the refresh operation. When an error is detected the alternate word line is selected. Otherwise the first word line is used.

DETAILED DESCRIPTION OF THE PREFERRED EMBODIMENT

Figures 1, 2:
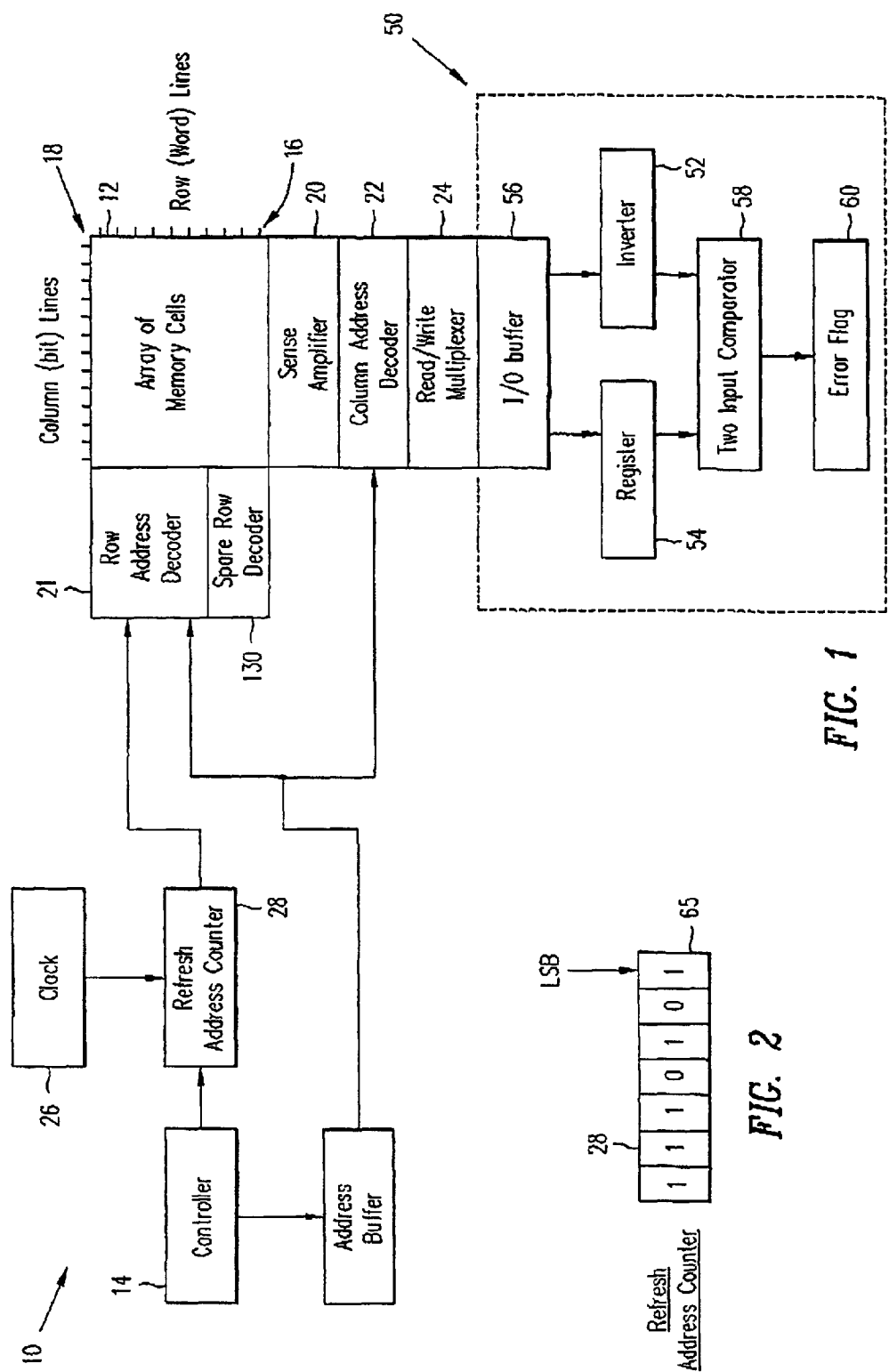
FIG. 1 illustrates a high-level simplified block diagram of a memory array system according to a preferred embodiment of the present invention.
FIG. 2 illustrates a high-level diagram of a refresh address counter according to a preferred embodiment of the invention.

With reference to FIG. 1, a block diagram of a memory system 10 includes a memory array 12 comprising a plurality of memory cells that are coupled to a corresponding memory array controller 14. Preferably, the memory array is a Dynamic Random Access Memory (DRAM). The memory system 10 may be used as part of a data processing system, such as a personal computer, to store data used by the processing system.

The DRAM circuit comprises a memory cell array having a plurality of dynamic memory cells arranged in the form of a matrix. Word lines 16 are connected to memory cells in the same row and bit lines 18 are connected to memory cells in the same column. External terminals are provided for the system, including a power supply terminal to which a supply of voltage is externally input.

The memory array 10 includes line precharges and sense amplifiers 20 that are coupled to the end of each column of memory cells and are utilized to precharge a bit (column) line. The memory array controller 14 controls the selection of which memory cells are to be read through the row address decoder 21 and column address decoder 22. A read/write multiplexer 24 coupled to a data input/output buffer is utilized to selectively read or write data to the memory cells depending on whether a read or write command was received.

Each memory cell in the memory array 12 typically has a single transistor and a single capacitor. A data signal written into a memory cell is stored in its associated capacitor and the logic state of the data signal is determined by the charge level of the capacitor. The capacitor, however, will dissipate its charge over time and requires periodic refreshing to maintain its charge. The periodic refreshing of a memory cell is commonly referred to as a refresh cycle. The refresh operations are controlled by the array controller 14 using a clock 26 to indicate when to perform the refresh operation. A refresh address counter 28 indicates the row address of cells being refreshed. During a typical refresh operation, data is read from each cell and stored in the sense latch, a buffer, or a register and then rewritten to the same row of cells.

According to the preferred embodiment, the memory array also includes a failure detection circuit 50. The failure detection circuit is used during refresh operations to detect a failed memory cell. The procedure for detecting failed cells is described in further detail below. The failure detection circuit includes an inverter 52 and a register 54 that are coupled to a data input/output buffer 56. The inverter 52 and register 54 provide inputs to a comparator 58 which compares the two sets of data from the inverter 52 and the register 54 to generate an error signal 60 in the event that the two sets of data are not identical. It should be noted that support logics such as the column address decoders and the data in/out buffers have self-checking logic and an advantageous embodiment provides an error signal in response to detecting a failure in the respective circuit.

The comparator compares the values provided from the register and the inverter. In the event that the value of one of the bits in a memory cell is stuck and not functioning properly (not retaining charge for the duration of refresh cycle), the value in the inverter will be inconsistent with the stored value in the register and will generate an error signal. As an example, if the values in the memory cells are 010, when inverted the values are 101. The stored value in the register from the previous refresh should also have the value 101 (as will be further described with reference to FIG. 3). When these two values are compared together and there is an inconsistency, the output will be driven high and will result in an error signal. If inconsistency shows in multiple bits of the addressed word, such a fault is called a "chip kill." The error signal provides a chip kill signal that indicates a hard failure in many bits of a word in the memory array. The bit error signal may then be employed by the system utilizing the memory array to initiate the necessary corrective measures.

A burn-in test mode signal generating circuit generates a burn-in test mode signal on the basis of predetermined signal input through some of the external terminals used in a normal operation of the DRAM circuit.

This invention represents an improved and more robust on-chip method for using read, compliment, write generation of an error signal. It uses the refresh address counter to determine if the data stored in a particular wordline is in true or compliment state without appending an extra status bit in each wordline. Therefore, it saves array chip area and reduces the dependence that all status bit cells be fully operational and error free.

Referring to FIG. 2, this invention adds an additional least significant bit 65 in the refresh address counter 28. This additional bit, set to "one" indicates compliment data in the wordline located at the address stored in the refresh address counter.

During a refresh operation, the address of the memory cell indicated by the refresh address counter will be refreshed. A read is performed to retrieve the data in the memory cell address indicated by address counter. The least significant bit of the refresh address counter is set to zero. The data retrieved from the indicated memory cell is inverted by being complimented via logic implemented per each bit line through a bit decoder. The complimented data is stored via normal write-back operations to the location in the memory array indicated by the refresh address counter. A copy of the wordline data is stored in the register 54.

For space-saving purposes, the refresh operation can be performed on a segment of a wordline. While this saves area, each memory cell requires refreshing more times in order to refresh all segments.

Figure 3:
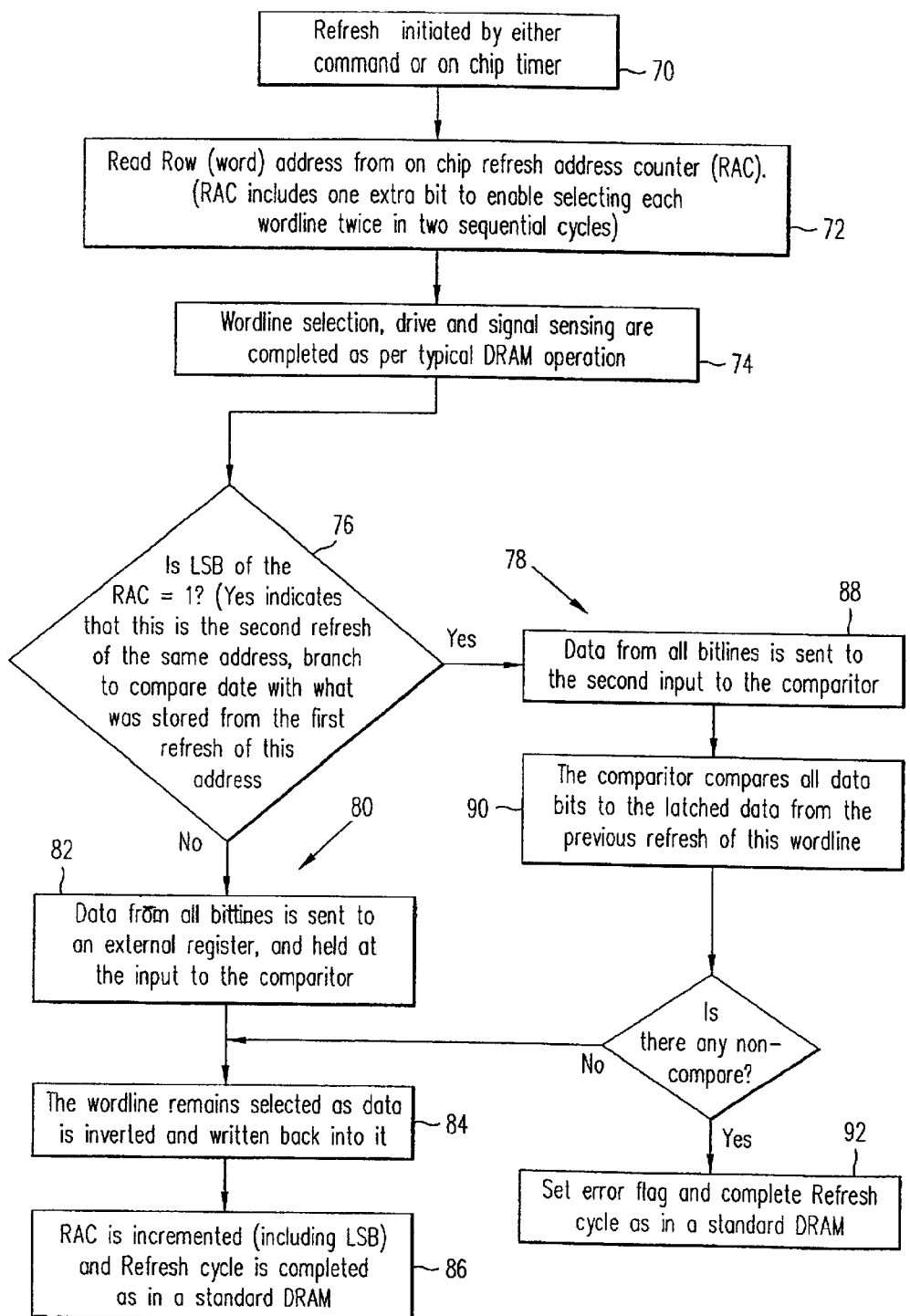
FIG. 3 illustrates a high-level flowchart of the refresh operation according to the preferred embodiment of the invention.

Referring to FIG. 3, the refresh operation is initiated by either a command from an external source or an on-chip timer 70. During the refresh operation, a row or word address indicated by the on-chip refresh address counter is read from the memory array. The refresh address counter includes one extra bit to enable selecting each wordline twice in two sequential cycles 72. The wordline selection, drive and signal sensing are completed as per typical DRAM operation 74. Next the least significant bit of the refresh address counter is checked to see if it is set to one 76. If it is, this indicates that this is the second refresh of the same address and a branch is made to compare the data with what was stored from the first refresh of this address 78.

When the least significant bit is set to zero 80, this indicates that this is the first refresh operation for this cell in this refresh cycle. When an address is being refreshed for the first time during a cycle, data from all bitlines are sent to an external register and held at the input to the comparator 82. The wordline remains selected as data is inverted and written back into it 84. The refresh address counter is incremented, including the least significant bit and the refresh cycle is completed as in a standard DRAM refresh operation 86. When it is the first refresh of that address and the least significant bit is set to zero, incrementing that bit turns it to one which then indicates that it will be the second refresh of that address. Since the remainder of the address is not changed, when it is the second refresh of the same address, and the bit is already set to one, incrementing that bit turns it to zero which will indicate that it is a new refresh address that has not been refreshed. That also increments the address to the next wordline or portion thereof as indicated by the refresh address counter.

During a refresh operation, when the least significant bit is detected to have been set to one 78, data from all the bit lines are sent to the second input of the comparator 88. The comparator then compares all data bits to the latched data in the register 54 from the previous refresh of this wordline 90. If there is a non-compare, then an error flag is set to indicate that there is a problem with that address not storing data properly and the refresh cycle continues as in a standard DRAM 92. The wordline remains selected as data is inverted and written back into it and the refresh address counter is incremented and the refresh cycle is complete as in the standard DRAM. Subsequent refresh operations repeat these steps dependent on whether the least significant bit is set to 1 or 0 in the refresh address counter.

Figure 4:
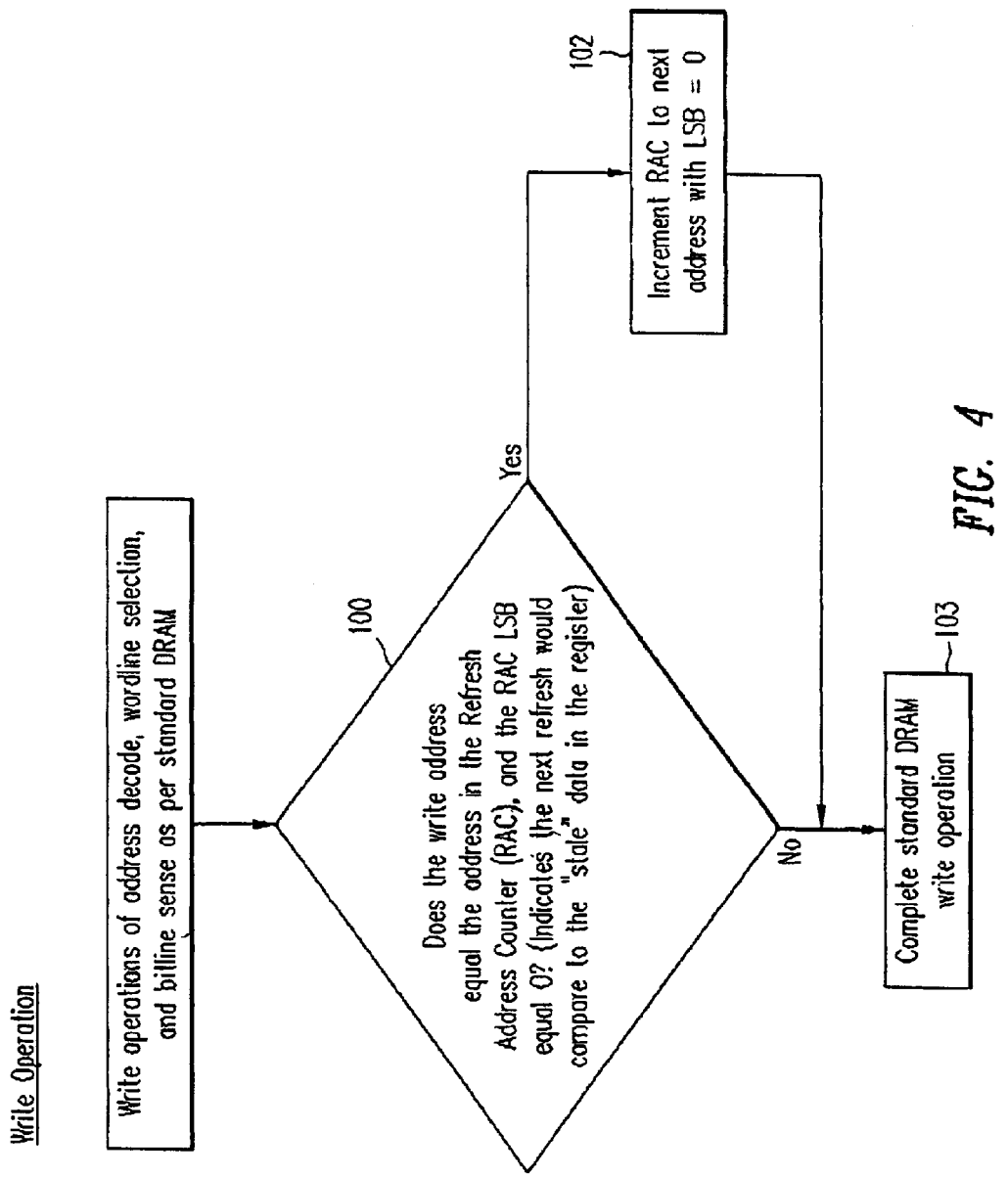
FIG. 4 illustrates a high-level flowchart of a write operation using the memory array of FIG. 1, according to the preferred embodiment of the invention.

Referring to FIG. 4, during a write operation the write is performed as would normally occur. Additionally, a check is performed to determine whether the write address equals the address in the refresh address counter and the least significant bit of the refresh address counter is set to zero 100. If so, this would indicate that the next refresh error detection operation would compare the updated data to the stale data in the register. Therefore, if the least significant bit is set to zero, than the refresh address counter is set to the next row address and the least significant bit is set to zero 102. In that way, the next refresh operation will be the first refresh of that next address and there is no comparison made for an error flag generation in that cycle. The standard DRAM write operation is then completed 103.

Figure 5:
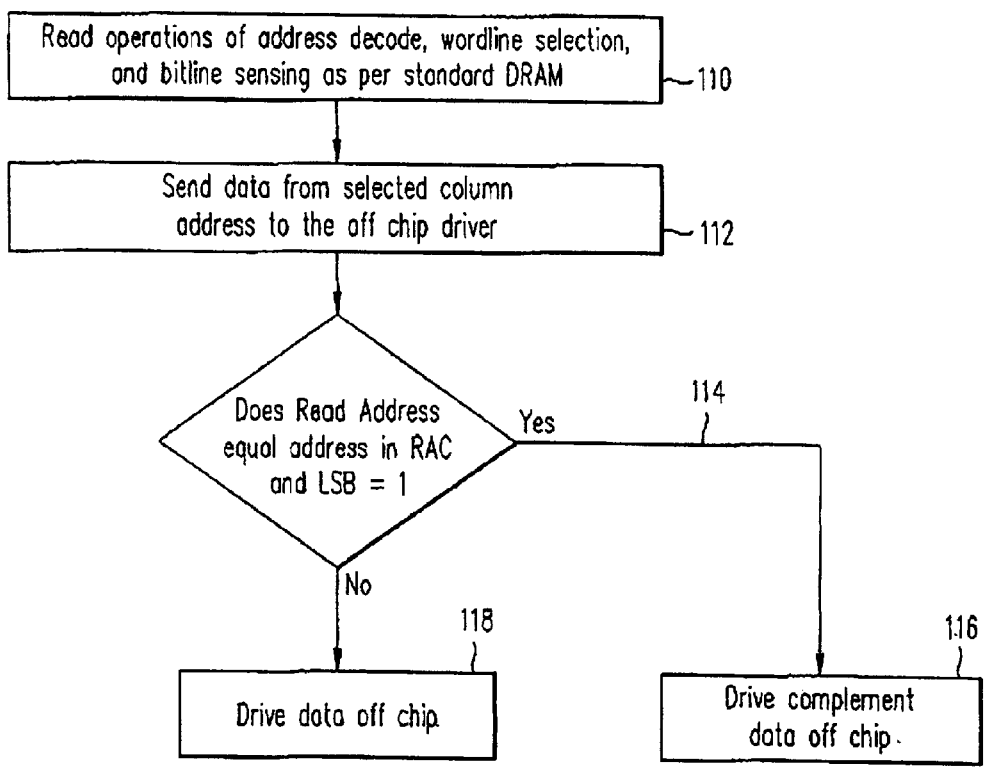
FIG. 5 illustrates a high-level flowchart of a read operation using the memory array of FIG. 1, according to the preferred embodiment of the invention.

Referring to FIG. 5, during a read operation, the address decode wordline selection and bitline sensing are performed as per standard DRAM 110. The data from the selected column address is sent to an off the chip driver 112. If the requested address equals the address in the refresh address counter and the least significant bit is set to one 114, the compliment data is driven off the chip 116, otherwise the data as stored is driven off of the chip 118.

Additional requirements for the chip architecture and circuitry include having an additional register equal to the number of bits in a wordline, compliment writeback logic, two comparators, one for comparing data stored in the register with the data in the subsequent refresh cycle and a second one to compare row addresses with the address stored in the refresh address counter to determine if true or compliment data is to be driven off of the chip for a read and to increment the refresh address counter for write operations during the compare. Also needed is the logic to drive true or compliment data off of the chip.

According to the preferred embodiment of the invention, with reference to FIG. 1, the DRAM circuit 10 also includes a fail-safe redundant arrangement of spare memory cells, spare wordlines, a spare row decoder and a wordline driving circuit 130.

The spare lines are made active to replace other wordlines using a system of fuse links. Fuse links are used to program extra spare bits of redundancy in a DRAM. This has been standard practice for many years. The fuses are wires that can be blown open. The extra rows of bits for data storage are programmed to replace the defective bits by blowing the appropriate fuses.

Fuse links are designed such that they are normally low resistance, and can be electrically opened through high resistance through the use of a laser. Fuse links latch circuits are designed such that the circuits output electrical low-levels if the fuse link is intact and output high-levels when the circuits are opened.

Each redundant row and column line has its own set of fuse links and fuse link latches. Each set contains one fuse link and latch circuit for each of the row addresses plus an additional enable link and latch circuit. Standard practice today is to program or blow-open the fuses for defective rows with a laser after the device is tested at wafer and before it is packaged.

The redundant element is selected only when the input row or column address compared with its corresponding fuse latch circuit output and the enable fuse latch output is high signifying that the enabled fuse was opened to enable the element.

In the preferred embodiment, "e-fuses" (electrical fuses) are used to reprogram the DRAM. E-fuses can be blown by an electric current. More particularly, an e-fuse is a fusible link which can be electrically opened by placing 5 volts across it. This can be done in place within the chip to repair packaged devices which fail after burn-in. Such e-fuses are well known to those skilled in the art. Electrically blown fuses predate laser fuses. The newer technology is to enable electrically blown fuses after packaging. Although this is not a standard practice throughout the industry, it is well known and used in production.

In a preferred embodiment, the testing of the wordlines of the array is used. In the event an error signal is found, the DRAM undergoes a process of self-repair by electrically blowing the appropriate fuses to replace the defective address currently in the refresh address counter with an extra redundant row of bits, thereby providing self-repair of the chip. More particularly, when an error is detected, the address stored in the refresh address counter is replaced with a spare address by blowing the corresponding e-fuses. Depending on the technology used for the e-fuse, an extra additional power supply may be required. In that way, the memory array can be scrubbed for hard failures. The circuitry of the present invention allows the scrubbing to be done without system intervention.

Otherwise, replacing defective memory cells requires on-chip error correction code, which carries a high chip size cost and a performance penalty. Using this invention reduces the chip size and improves performance.

Moreover, using the on-chip error detection circuitry allows the on-chip memory controller to optimize refresh intervals. Since retention time is very strongly coupled to temperature and the cell signal strength is strongly related to other external environmental conditions, having all the testing performed within the chip in the system in which it will function, minimizes external factors which contribute to refresh requirements.

In another preferred embodiment, the system monitors fails and adjusts the refresh interval, the time between refresh cycles, depending on the requirements of the memory cells within the chip. This allows the system to increase the interval during periods of inactivity when the device is cooler and other environmental conditions are favorable. This in turn reduces the power consumed by the device. Additionally, a device uses its own error signal to adjust its own self-refresh interval.

Using this system allows a single part number to be used to satisfy low power and standard power applications. Each part self-regulates the refresh interval thereby optimizing power consumption. The need to sort for a separate low-power part number is therefore eliminated allowing for the use of a generic part number.

Figure 6:
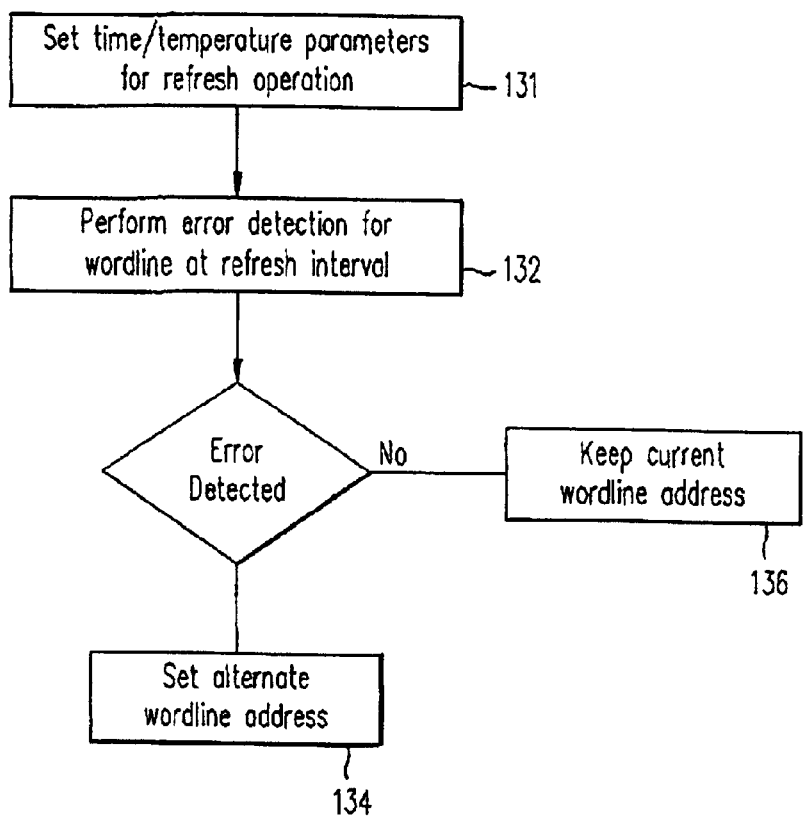
FIG. 6 illustrates a flowchart for optimizing the memory array according to the preferred embodiment of the invention.

Referring to FIG. 6, the process for optimizing refresh intervals is shown. First, the time and temperature parameters are set for the refresh operation 131. An error detection operation is performed for a wordline at a given refresh interval 132. If an error is detected, then an alternate wordline address is set 134, otherwise the current wordline address is used 136.

The previously described error detection during refresh operations method is used by the memory chip to identify memory rows or columns with defective memory cells. These defective memory cells are then replaced by spare rows or columns within the array chip. This enhances the "all good" array chip yield and thus reduce costs.

Additionally, the previously described error detection during refresh operations method is also used to test memory cells for data retention time at different array refresh rates such as 4, 8, 16, 32, 64, 128, 256, and 512 milliseconds and even at a 1 second and longer refresh rate. The reallocation of redundant memory cells based on the cell's ability to retain data with relatively infrequent refresh operations enables the designation of chips for very low power environments. The tested chips can be sorted by various standby power dissipation rates.

In the preferred embodiment, the device is tested at wafer level. Test equipment analyzes the failure data and determines if the redundancy can correct all the failures and, if so, which fuse links need to be opened. Laser fuse blow equipment opens the appropriate links.

The fuse link is replaced with an element which is normally low-resistance, but after the passage of a high current through it, becomes high-resistance. A fuse blow circuit is included in the design such that when initiated, it places a sufficiently high current through the fuse link causing it to change from a low-resistant state to a high resistant state. There are various types of e-fuse devices. This particular choice is for illustrative purposes. Other devices may be normally high-resistancy, which can be programmed to be low resistance and the programming method may be with high current or high voltage.

Fuse link programming can be done on the same test equipment without the need of lasers. A significant advantage of this method is the ability to repair devices after the devices have been packaged. Test equipment is still required to identify which fusible links need to be programmed.

Since the circuitry of the read compare/write operation identifies defective addresses, a device with an e-fuse circuit can essentially repair itself. When a failure is identified, the device can determine if there is any unused redundancy still available. If additional redundant elements are available, the electrical blowing of the fuses to match the address in the refresh address counter is performed. The enabled fuse will allow selection of the new redundant word line. Data stored in the comparator used to identify the fails will then be written into the new redundant line, thereby repairing it. This operation requires several additional cycles and can be triggered by a repair command from the system.

In that way retention can be tuned to the specific applications depending on temperature and voltage. This way several customer requirements can be supported without the need to design several unique parts. Yield to the part numbers is higher because successive guard banding of temperature voltage is eliminated. Also the parts can be repaired on a real-time basis based on failures.

In an advantageous embodiment, sets of instructions for executing the methods disclosed herein are resident in RAM of one or more of the data processing systems. These instructions may reside in various types of signal-bearing media. In this respect, one aspect of the present invention concerns a programmed product that includes signal-bearing media tangibly embodying a program of machine-readable instructions executable by a digital data processor to perform the error detection and power saving methods described above. The present invention does not contemplate limiting its practice to any particular type of signal bearing media, i.e., computer readable medium, utilized to actually carry out the distribution. Examples of signal bearing media includes recordable type media, such as floppy disks and hard drives, and transmission type media such as digital and analog communication links and wireless. In other advantageous embodiments, the computer program product may also be stored at another computer and transmitted to a user's computer system by an internal or external communication network, e.g. LAN or WAN, respectively.

It should be noted that although the present invention has been described, in one embodiment, in the context of a computer system, those skilled in the art will readily appreciate that the present invention is also capable of being distributed as a computer program product in a variety of forms; the present invention does not contemplate limiting its practice to any particular type of signal bearing media, i.e., computer readable medium, utilized to actually carry out the distribution.

While the invention has been particularly shown and described with reference to a preferred embodiment, it will be understood by those skilled in the art that various changes in for and detail may be made therein without departing from the spirit and scope of the invention.

We claim:

1. A memory system comprising:

a memory array comprising a plurality of rows of memory cells, each row having an address, wherein each memory cell stores volatile data requiring periodic refreshing;

a refresh controller controlling the periodic refreshing of data in each row of memory cells;

a refresh addresss counter indicating the address of a row of cells to be refreshed;

a temporary data storer for storing data from the memory cell indicated for refreshing;

a data inverter for inverting data from the memory cell indicated for refreshing;

a comparater associated with the temporary data storer and the data inverter; and an indicator bit associated with the refresh address counter indicating whether the data stored at the address indicated by the refresh address counter is inverted.

2. The memory system of claim 1 further comprising:

a plurality of redundant rows of cells; and a set of e-fuses for redirecting data requests for a cell having a detected error to a redundant cell.

3. The memory system of claim 1 wherein the refresh address counter indicates a portion of a row of cells.

4. The memory of claim 1 further comprising:

a deactivation controller for deactivating a row of cells a cell address controller for redirecting a request for a row to a second row of cells when the requested row is deactivated; and a test system for testing each row of cells for the ability to store data without being refreshed for a designated period of time wherein a row that is unable to store data without being refreshed for the designated time is deactivated and replaced with another row.

5. The memory system of claim 4 wherein the test system tests the ability of each row of cells to retain data at a designated temperature.

* * * * *